United States Patent [19]

Sheng et al.

[11] Patent Number: 5,904,540

[45] Date of Patent: May 18, 1999

[54] METHOD FOR MANUFACTURING SHALLOW TRENCH ISOLATION

[75] Inventors: Yi-Chung Sheng; Jih-Wen Chou, both of Hsinchu, Taiwan

[73] Assignee: United Microelectronics, Corp., Taiwan

[21] Appl. No.: 08/994,987

[22] Filed: Dec. 19, 1997

[30] Foreign Application Priority Data

Oct. 18, 1997 [TW] Taiwan ................................ 86115356

[51] Int. Cl.⁶ .................................................. H01L 21/76
[52] U.S. Cl. .......................... 438/427; 438/431; 438/437
[58] Field of Search .................................... 438/424, 425, 438/426, 427, 429, 433, 435, 437, 430, 431

[56] References Cited

U.S. PATENT DOCUMENTS

| | | | |
|---|---|---|---|
| 4,495,025 | 1/1985 | Haskell | 438/427 |
| 5,298,450 | 3/1994 | Verret | 438/427 |
| 5,643,823 | 7/1997 | Ho et al. | 438/437 |
| 5,683,932 | 11/1997 | Bashir et al. | 438/437 |
| 5,731,221 | 3/1998 | Kwon | 438/437 |
| 5,795,811 | 8/1998 | Kim et al. | 438/435 |

Primary Examiner—Donald L. Monin, Jr.
Assistant Examiner—Anh D. Mai
Attorney, Agent, or Firm—Rabin & Champagne, P.C.

[57] ABSTRACT

A method for forming shallow trench isolation comprising the steps of providing a substrate having a mask layer formed thereon. Next, the mask layer is patterned to form a first trench in the substrate. Then, dielectric spacers are formed on the sidewalls of the first trench. After that, a second trench is formed in the substrate by an etching operation following the profile of the dielectric spacers. Next, a second dielectric layer is formed filling the second trench, wherein the second dielectric layer and the dielectric spacers are formed from different materials. Thereafter, the dielectric spacers are removed to form recess cavities, and then a filler material is deposited into the recess cavities. Subsequently, a gate oxide layer is formed over the filler material and the substrate. Finally, a polysilicon gate layer is formed over the gate oxide layer.

25 Claims, 4 Drawing Sheets

METHOD FOR MANUFACTURING SHALLOW TRENCH ISOLATION

BACKGROUND OF THE INVENTION

1. Field of Invention

The present invention relates to a method for isolating integrated circuit element. More particularly, the present invention relates to the method for manufacturing shallow trench isolation (STI).

2. Description of Related Art

In general, a complete integrated circuit is made from millions of MOS transistors. To prevent the short-circuiting of adjacent MOS transistors, an isolating dielectric layer referred to as "field oxide layer" (FOX) must be placed between two neighboring transistors. Alternatively, shallow trench isolation must be made by etching a trench between the neighboring transistors followed by filling in insulating material to define an active area.

FIGS. 1A through 1D are cross-sectional views showing the progression of manufacturing steps in the production of a conventional shallow trench isolation. First, as shown in FIG. 1A, a substrate 10 is provided. Then, a pad oxide layer 22 and a silicon nitride layer ($Si_3N_4$) 24 are sequentially formed over the substrate 10. Conventional photolithographic and etching techniques are then used to define a trench 30 in the substrate 10.

Next, as shown in FIG. 1B, an oxide layer is deposited into the trench filling the trench and covering the silicon nitride layer 24. Later, a chemical-mechanical polishing operation is performed to planarize and remove the extra oxide material above the silicon nitride layer 24 forming an oxide layer 34.

Next, as shown in FIG. 1C, the silicon nitride layer 24 and the pad oxide layer 22 are removed to form the device isolation structure. The pad oxide is removed using a wet etching method with hydrofluoric acid solution as the etchant. Using such isotropic etching method, surface of the oxide layer 34 adjacent to the substrate 10 can be over-etched quite easily due to the immersion in hydrofluoric acid solution during the etching operation. This will result in the formation of recesses 38 on the surface of the oxide layer 34 adjacent to the substrate 10. Moreover, to protect the substrate surface, normally a sacrificial layer will be formed above the substrate after the formation of the field oxide regions. Hence, when the sacrificial layer is removed in a subsequent process, the hydrofluoric acid used in the removal process will also lead to an over-etching of the oxide layer 34 adjacent to the substrate 10.

Next, as shown in FIG. 1D, the recesses 38 formed on the surface of the oxide layer 34 adjacent to the substrate 10 exposes the substrate surface 10 only a little. Therefore, a thin gate oxide layer 40 will be grown there in a subsequent process. A thin gate oxide layer 40 not only will lower the reliability of the gate, but will also lead to the accumulation of charges near the upper trench comers, and hence the electric field surrounding that area is increased. This has the adverse effect of lowering the threshold voltage of the device and the generation of abnormal subthreshold current commonly referred to as a "kink" effect. Moreover, near the corner of the main active area, a corner parasitic MOSFET will be created, thereby leading to the development of a leakage current. The lowering of the threshold voltage, abnormal subthreshold current and current leakage all contribute to the lowering of device quality and the reduction of the product yield.

In light of the foregoing, there is a need to provide an improved structure and method of forming shallow trench isolation.

SUMMARY OF THE INVENTION

Accordingly, the present invention is directed to a method for manufacturing shallow trench isolation. Through the formation of dielectric spacers in the early stage of the processing, the oxide layer will not be over-etched during the wet etching operation. Hence, no recesses will be formed on the surface of the oxide layer adjacent to the substrate. Consequently, threshold voltage will not be lowered and device current leakage problems caused by a kink effect and a corner parasitic MOSFET can be avoided, thereby leading to increase functionality of the device.

To achieve these and other advantages and in accordance with the purpose of the invention, as embodied and broadly described herein, the invention provides a method for forming shallow trench isolation. The method comprises the steps of providing a substrate having a mask layer formed thereon. Next, the mask layer is patterned to form a first trench in the substrate. Then, dielectric spacers are formed on the sidewalls of the first trench. After that, a second trench is etched in the substrate following the profile of the dielectric spacers. Next, a second dielectric layer is formed filling the second trench, wherein the second dielectric layer and the dielectric spacers are formed from different materials. Thereafter, the dielectric spacers are removed to form recess cavities, and then a filler material is deposited into the recess cavities. Subsequently, a gate oxide layer is formed over the filler material and the substrate. Finally, a polysilicon gate layer is formed over the gate oxide layer.

According to one preferred embodiment of this invention, the mask layer is a composite layer including a pad oxide layer and a silicon nitride layer. The step of forming the mask layer includes forming a pad oxide layer over the substrate surface first, then forming a silicon nitride layer over the pad oxide layer, and finally patterning and etching the pad oxide layer and the silicon nitride layer. The pad oxide layer can be formed by carrying out a thermal oxidation operation. The steps in fabricating the dielectric spacers include forming a liner oxide layer over the exposed substrate surface in the interior of the first trench first, then forming a dielectric layer over the liner oxide layer and the mask layer, and finally etching back the dielectric layer to form the dielectric spacers. The liner oxide layer can be a silicon dioxide layer formed by a thermal oxidation method. The dielectric layer can be formed by depositing silicon nitride, and the dielectric layer can be etched back to form the spacers using a plasma dry etching method. Furthermore, before the filling of the second trench, can further includes the formation of a layer of liner oxide over the exposed substrate surface, wherein the liner oxide layer is a silicon dioxide layer formed by a thermal oxidation method. The steps of filling the second trench include depositing a dielectric material over the second trench and the mask layer, and then polishing to remove the top portion of the dielectric layer and the mask layer. The polishing method includes using a chemical-mechanical polishing operation. The dielectric spacers can be removed using an isotropic etching method, such as etching with hot phosphoric acid. In addition, the steps of depositing filler material into the recess cavities include removing the pad oxide layer first, and then forming a sacrificial oxide layer over the exposed surface; next, the filler material is deposited into the recess cavities and extending to each side above the second trench; subsequently, the filler material is etched back using the sacrificial oxide layer as an etching stop layer; and finally, the sacrificial oxide layer is removed. The pad oxide layer can be removed using a wet etching method. The sacrificial oxide layer can be formed by depositing silicon dioxide using a thermal oxidation method. The filler material includes a conductive material such as polysilicon, or an insulating material such as silicon nitride. The sacrificial oxide layer is removed using a wet etching method.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
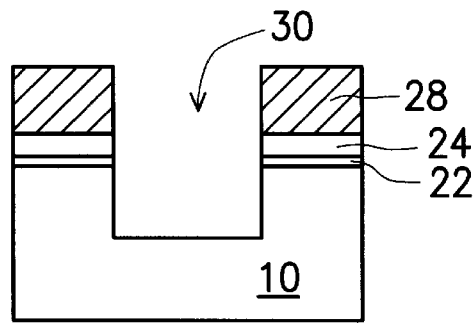
FIGS. 1A through 1D are cross-sectional views showing the progression of manufacturing steps in the production of a conventional shallow trench isolation.
Figure 1B:
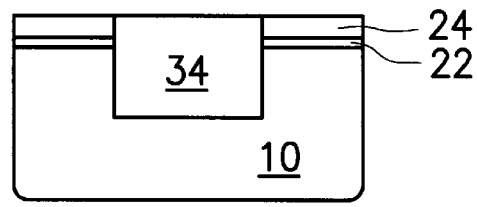
Figure 1C:
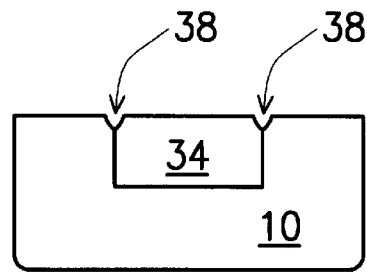
Figure 1D:
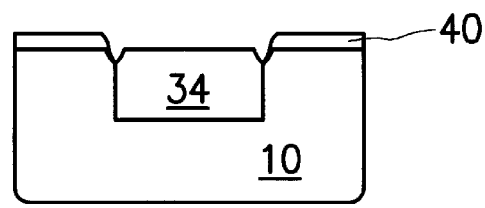

Reference will now be made in detail to the present preferred embodiments of the invention, examples of which are illustrated in the accompanying drawings. Wherever possible, the same reference numbers are used in the drawings and the description to refer to the same or like parts.

Figure 2A:
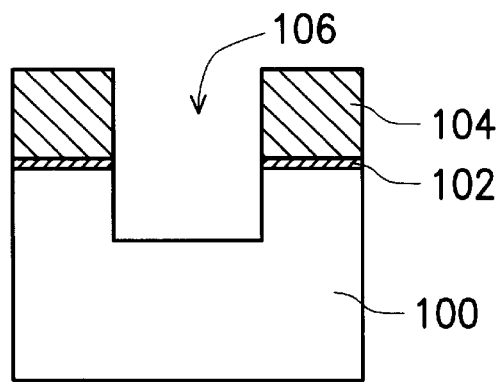
FIGS. 2A through 2I are cross-sectional views showing the progression of manufacturing steps in the production of shallow trench isolation according to one preferred embodiment of this invention.

FIGS. 2A through 2I are cross-sectional views showing the progression of manufacturing steps in the production of shallow trench isolation according to one preferred embodiment of this invention. First, as shown in FIG. 2A, a substrate 100 is provided. Then, a pad oxide layer 102 is formed over the substrate 100. The pad oxide layer 102, for example, can be a silicon dioxide ($SiO_2$) layer formed using a thermal oxidation method. Next, a silicon nitride layer 104 is formed over the pad oxide layer 102 using, for example, a plasma chemical vapor deposition method. Then, using conventional photolithographic and etching techniques, the pad oxide layer 102 and the silicon nitride layer 104 are patterned and then selectively etched to form an opening in the pad oxide layer and the silicon nitride layer 104. The etched pad oxide layer 102 and the silicon nitride layer 104 together constitute a mask layer. Subsequently, the substrate is further etched to form a trench 106.

Figure 2B:
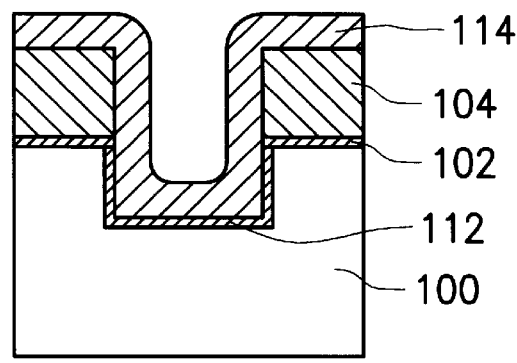

Next, as shown in FIG. 2B, a liner oxide layer 112 is formed over the bottom and the sidewalls of the trench 106 using a thermal oxidation method. The liner oxide layer 112 is in fact connected to the pad oxide layer 102 to form a continuous layer so that the upper trench corners are smoother. Thereafter, a second silicon nitride layer 114 is deposited over the liner oxide layer 112 and the first silicon nitride layer 104 using, for example, a chemical vapor deposition (CVD) method.

Figure 2C:
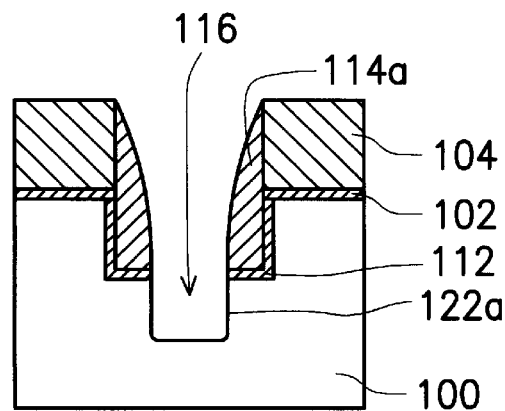

Next, as shown in FIG. 2C, the second silicon nitride layer 110 is etched back to form silicon nitride spacers 114a on the sidewalls of the mask layer using, for example, a dry etching method. After that, portions of the substrate 100 is further etched in a downward direction following the profile of the silicon nitride spacers 114a to form a trench 116 using, for example, an anisotropic method. The interior surface 122a of the trench 116 exposes a portion of the substrate 100. Due to the formation of silicon nitride spacers 114a, the first silicon nitride layer 104 and the pad oxide layer 102 does not have a direct contact with the interior surface of trench 116.

Figure 2D:
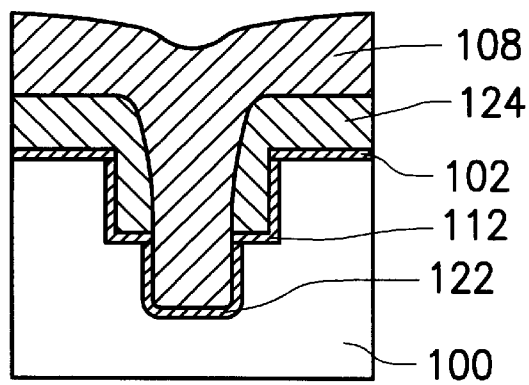

Next, as shown in FIG. 2D, a liner oxide layer 122 is formed on the bottom and sidewalls of the trench 116 using, for example, a thermal oxidation method. The liner oxide layer 122 formed hereon is connected to the previously formed liner oxide layer 112. Subsequently, an oxide layer 108 is formed to fill the trench 116 and extended to cover the silicon nitride layer 104 and the silicon nitride spacers 114a, together referred to as a silicon nitride layer 124. The oxide layer 108 and the silicon nitride layer 124 are made from different materials. Later, a high temperature is used to densify the oxide layer 108, after which the oxide layer will shrink a little.

Figure 2E:
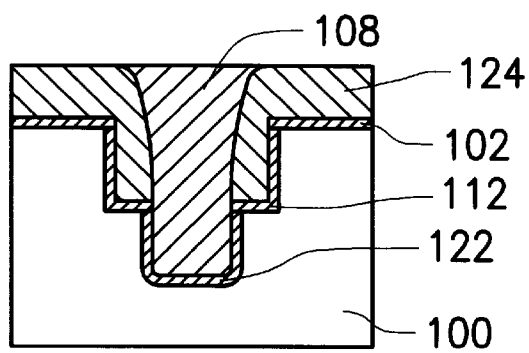

Next, as shown in FIG. 2E, a chemical-mechanical polishing (CMP) operation is used to planarize the oxide layer 108 and the silicon nitride layer 124. The oxide layer 108 above the silicon nitride surface 124 and a portion of the silicon nitride layer 124 itself will be removed during the CMP operation.

Figure 2F:
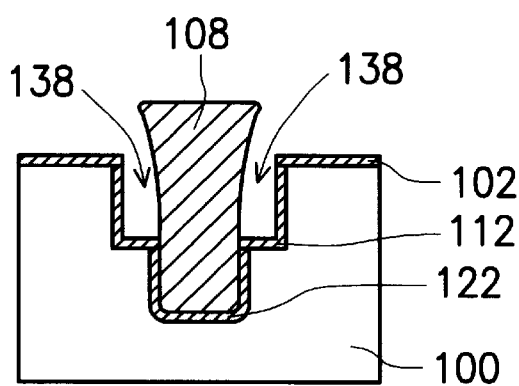

Next, as shown in FIG. 2F, an isotropic etching method using hot phosphoric acid, for example, is employed to remove the silicon nitride layer 124. The pad oxide layer 102 and the liner oxide layer 112 are used as an etching stop layer in the etching operation, and recess cavities 138 are finally formed on each side of the oxide layer 108.

Figure 2G:
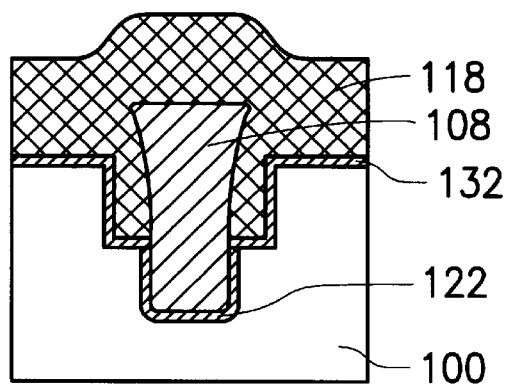

Next, as shown in FIG. 2G, the pad oxide layer 102 as shown in FIG. 2F may be damaged during the aforementioned silicon nitride etching operation. Therefore, to obtain a better quality, a wet etching method can be used to remove the pad oxide layer first, and then a thermal oxidation method can be used to form a sacrificial oxide layer 132 over the exposed substrate surface. Consequently, the occurrence of channel effects in subsequent processing operations can be prevented and the substrate 100 is protected. Next, a conductive material such as polysilicon or an insulating material such as silicon nitride is deposited above the sacrificial oxide layers 132 and the shallow trench isolation oxide layer 108.

Figure 2H:
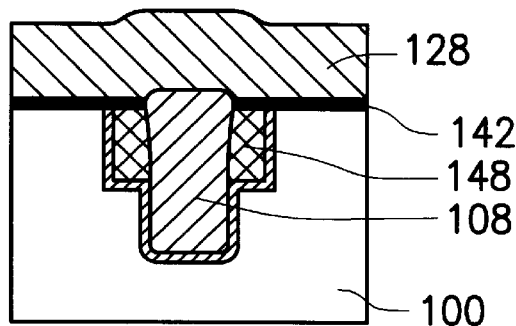

If a conductive material such as polysilicon is deposited to form a polysilicon layer 118 in the above step, then the polysilicon layer 118 is etched back as shown in FIG. 2H. Next, the exposed sacrificial oxide layer 132 is removed. Thereafter, a gate oxide layer 142 is formed over the exposed substrate 100 using a thermal oxidation method. Since the top surface of the polysilicon layers 148 in the recess cavities 138 will also be oxidized similar to the substrate during the thermal oxidation operation, a continuous gate oxide layer 142 is able to form over the substrate 100 and the polysilicon layer 148. Finally, a polysilicon gate 128 is formed over the gate oxide layer 142 and the oxide layer 108. As seen from the FIG. 2H, no recesses are generated above the gate oxide layer 142 using the method of this invention. Consequently, a more stable device structure is formed.

Figure 2I:
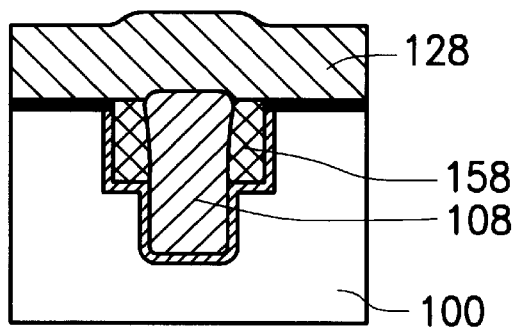

Alternatively, if an insulating material such as silicon nitride is deposited above the sacrificial oxide layers 132 and the shallow trench isolation oxide layer 108 to form a silicon nitride layer 118, then the silicon nitride layer 118 is etched back as shown in FIG. 2I. Next, the exposed sacrificial oxide layer 132 is removed. Thereafter, a gate oxide layer 142 is formed over the exposed substrate 100 using a thermal oxidation method. Unlike the substrate, the top surface of the silicon nitride layers 158 in the recess cavities 138 will not be oxidized during the thermal oxidation operation, hence a gate oxide layer 142 is able to form over the substrate 100 only. Finally, a polysilicon gate 128 is formed over the gate oxide layer 142 and over the oxide layer 108. As seen from the FIG. 2I, no recesses are produced above the gate oxide layer 142 using the method of this invention. Consequently, a more stable device structure is formed.

Through the formation of dielectric spacers in the early stage of the processing, the method of forming shallow trench isolation in this invention can prevent an over-etching of the oxide layer during a wet etching operation. Hence, no recesses will be formed on the surface of the oxide layer adjacent to the substrate. Consequently, threshold voltage will not be lowered and current leakage problems due to a kink effect and corner parasitic MOSFET can be avoided, thereby leading to increase functionality of a device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing shallow trench isolation comprising the steps of:

providing a substrate;

forming a mask layer over the substrate;

patterning the mask layer;

forming a first trench in the substrate using the patterned mask;

forming dielectric spacers in the interior of the first trench;

etching into the substrate following the profile of the dielectric spacers to form a second trench;

depositing a second dielectric layer that fills the second trench, wherein the second dielectric layer and the dielectric spacers are made from different materials;

removing the dielectric spacers to form recess cavities;

depositing a filler material into the recess cavities;

forming a gate oxide layer over the substrate and over the filler material; and depositing a polysilicon gate over the gate oxide layer.

2. The method of claim 1, wherein the step of forming the mask layer includes depositing a pad oxide layer and a silicon nitride layer.

3. The method of claim 1, wherein the step of forming the mask layer includes the substeps of:

forming a pad oxide layer over the substrate;

forming a silicon nitride layer over the pad oxide layer; and etching the pad oxide layer and the silicon nitride layer.

4. The method of claim 3, wherein the step of forming the pad oxide layer includes a thermal oxidation method.

5. The method of claim 1, wherein the step of forming dielectric spacers in the first trench includes the substeps of:

forming a liner oxide layer on the expose substrate surface inside the trench interior;

forming a dielectric layer over the liner oxide layer and over the mask layer; and etching back the dielectric layer to form the dielectric spacers.

6. The method of claim 5, wherein the step of forming the liner oxide layer includes depositing silicon dioxide.

7. The method of claim 5, wherein the step of forming the liner oxide layer includes a thermal oxidation method.

8. The method of claim 5, wherein the step of forming the dielectric layer includes depositing silicon nitride.

9. The method of claim 5, wherein the step of etching back includes a dry etching method.

10. The method of claim 1, wherein after the step of forming the second trench but before filling the trench with the second dielectric material, further includes forming a liner oxide layer on the exposed substrate inside the second trench.

11. The method of claim 10, wherein the step of forming the liner oxide layer includes depositing silicon dioxide.

12. The method of claim 5, wherein the step of forming the liner oxide layer includes a thermal oxidation method.

13. The method of claim 1, wherein the step of filling the second trench with second dielectric material includes the substeps of:

depositing a dielectric material filling the second trench and over the mask layer; and polishing away the dielectric layer and the top portion of the mask layer.

14. The method of claim 13, wherein the step of polishing includes a chemical-mechanical polishing method.

15. The method of claim 1, wherein the step of removing the dielectric spacers include an isotropic etching operation.

16. The method of claim 15, wherein the step of performing an isotropic operation includes using hot phosphoric acid.

17. The method of claim 1, wherein the step of depositing a filler material into the recess cavities includes the substeps of:

removing the pad oxide layer;

forming a sacrificial oxide layer over the substrate;

depositing a filler material into the recess cavities and extending into regions above the second trench;

etching back the filler material using the sacrificial oxide layer as an etching stop layer; and removing the sacrificial oxide layer.

18. The method of claim 17, wherein the step of removing the pad oxide layer includes a wet etching method.

19. The method of claim 17, wherein the step of forming the sacrificial oxide layer includes depositing silicon dioxide.

20. The method of claim 17, wherein the step of forming the sacrificial oxide layer includes a thermal oxidation method.

21. The method of claim 17, wherein the filler material includes a conductive material.

22. The method of claim 21, wherein the conductive material includes polysilicon.

23. The method of claim 17, wherein the filler material includes insulating material.

24. The method of claim 23, wherein the insulating material includes silicon nitride.

25. The method of claim 17, wherein the step of removing the sacrificial oxide layer includes a wet etching method.

* * * * *